United States Patent
Bukris et al.

(10) Patent No.: US 8,762,808 B2
(45) Date of Patent: Jun. 24, 2014

(54) MULTI-PROCESSING ARCHITECTURE FOR AN LTE TURBO DECODER (TD)

(75) Inventors: Moshe Bukris, Rishon Lezion (IL); Shai Kalfon, Hod Hasharon (IL); Yair Amitay, Shoham (IL)

(73) Assignee: LSI Corporation, San Jose, CA (US)

( * ) Notice: Subject to any disclaimer, the term of this patent is extended or adjusted under 35 U.S.C. 154(b) by 185 days.

(21) Appl. No.: 13/402,088

(22) Filed: Feb. 22, 2012

(65) Prior Publication Data

US 2013/0219242 A1 Aug. 22, 2013

(51) Int. Cl.
*H03M 13/00* (2006.01)

(52) U.S. Cl.
USPC .............................. 714/755; 714/773; 714/786

(58) Field of Classification Search
USPC .......................................... 714/755, 786, 773
See application file for complete search history.

(56) References Cited

U.S. PATENT DOCUMENTS

| | | | |
|---|---|---|---|
| 7,480,846 B2 | 1/2009 | Charpentier et al. | 714/755 |
| 7,647,547 B2 | 1/2010 | Garrett et al. | 714/796 |
| 7,702,968 B2 | 4/2010 | Pan et al. | 714/701 |
| 7,835,315 B2 | 11/2010 | Pi et al. | 370/312 |
| 7,954,016 B2 | 5/2011 | Pan et al. | 714/701 |
| 2005/0022101 A1* | 1/2005 | Malm et al. | 714/801 |
| 2005/0174933 A1 | 8/2005 | Sakoda et al. | 370/208 |
| 2007/0124655 A1* | 5/2007 | Wang et al. | 714/786 |
| 2008/0163022 A1 | 7/2008 | Koshy et al. | 714/752 |
| 2009/0138668 A1 | 5/2009 | Blankenship | 711/157 |
| 2011/0131393 A1 | 6/2011 | Ramchandran et al. | 712/37 |
| 2011/0173507 A1* | 7/2011 | Wong et al. | 714/746 |

\* cited by examiner

*Primary Examiner* — Guy Lamarre
(74) *Attorney, Agent, or Firm* — Christopher P. Maiorana, PC (57) ABSTRACT

An apparatus comprising a decoder circuit and a memory. The decoder circuit may be configured to generate a single address signal to read a first parity data signal, a second parity data signal and read and/or write systematic information data, a first a-priori-information signal and a second a-priori-information signal. The decoder circuit (i) reads the first parity data signal, the systematic information data and the first a-priori-information during even half-iterations of a decoding operation and (ii) reads the second parity data, the systematic information data and the second a-priori-information during odd half-iterations of the decoding operation. The memory may be configured to store the systematic information data and the first and second a-priori-information signals such that each are accessible by the single address signal.

12 Claims, 13 Drawing Sheets

MULTI-PROCESSING ARCHITECTURE FOR AN LTE TURBO DECODER (TD)

FIELD OF THE INVENTION

The present invention relates to signal processing generally and, more particularly, to a method and/or apparatus for implementing a multi-processing architecture for an LTE turbo decoder (TD).

BACKGROUND OF THE INVENTION

Conventional multi processing architectures can process vectors in parallel. Such architectures include vector processors, accelerators and DSPs. Implementing a turbo decoder (TD) is a demanding task. Turbo decoders use a high frequency design, high parallel architectures, special address generation units (AGUs) and/or special memory designs. Turbo Decoders are often implemented using custom hardware.

The up-link (UL) LTE-advance high bit-rate is enabled by, among other things, the highly parallelism architecture, which is needed to implement a LTE turbo decoder. The high parallelism has become possible due to the usage of QPP-interleavers. A proper design enables a QPP-interleaver to access a multibank memory without contentions (there are no memory conflicts, which stall the processing).

The parallel processing architecture along with the parallel access to a multibank contention free memory, enable reducing the decoding time and thus increasing the bit-rate. In the parallel LTE TD design, P processors access concurrently multibank (P-bank) memory to read the P systematic information data (s) and read/write the P a-priori-information ($\lambda$) data.

In order to achieve the specified LTE\LTE-advance bit-rate, parallel access to a multibank and contention free memory should be designed and implemented for the LTE TD. Moreover, as the parallelism grows (up to degree of 64 for block-code with size of 6144 bits), the number of AGUs needed for reading and writing s and $\lambda$ is also grows linearly.

There are TD designs where s is read only in the first ½ iteration. At the end of each ½ iteration the output provided for next ½ iteration is s+$\lambda$ (where s+$\lambda$ is used for gamma calculation). Therefore, instead of loading s and $\lambda$ separately, one AGU is used to load s+$\lambda$.

It would be desirable to implement a multi-processing architecture to implement a LTE turbo-decoder (TD).

SUMMARY OF THE INVENTION

The present invention concerns an apparatus comprising a decoder circuit and a memory. The decoder circuit may be configured to generate a single address signal to read a first parity data signal, a second parity data signal and read and/or write systematic information data, a first a-priori-information signal and a second a-priori-information signal. The decoder circuit (i) reads the first parity data signal, the systematic information data and the first a-priori-information during even half-iterations of a decoding operation and (ii) reads the second parity data, the systematic information data and the second a-priori-information during odd half-iterations of the decoding operation. The memory may be configured to store the systematic information data and the first and second a-priori-information signals such that each are accessible by the single address signal.

The objects, features and advantages of the present invention include providing a multi-processing architecture that may (i) be implemented as a turbo decoder, (ii) be implemented using a single bank of memory and/or (iii) be implemented with reduced die area.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

The present invention may reduce and/or eliminate the need for a multibank memory with parallel access in a turbo encoder implementation. Such a memory is often implemented in a LTE parallel processing turbo decoders (TDs). Instead of a multibank memory, a single bank memory may be used to implement an LTE TD with similar asymptotically performance. The single bank memory may be used to achieve multiple/vector data access in a single memory operation. The single memory operation multiple/vector data access may be easily implemented on a DSP architecture.

Figure 1:
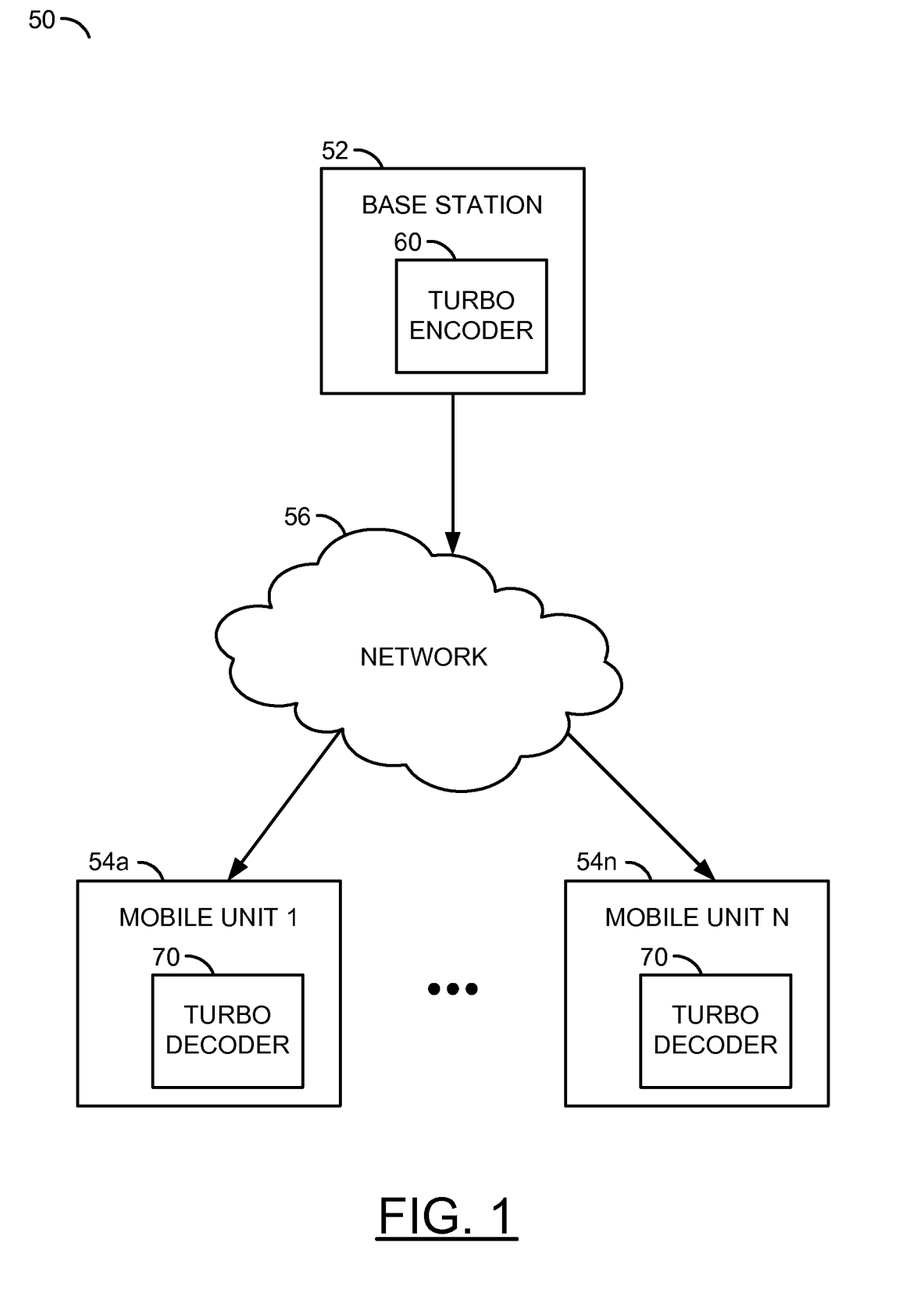
FIG. 1 is a block diagram illustrating an example context of a turbo encoder and a number of decoders in accordance with the present invention.

Referring to FIG. 1, a diagram of a system 50 is shown illustrating an example communication system in accordance with an example implementation of the present invention. The system 50 may include, but is not limited to, a base station (or unit) 52 and a number of mobile stations (or units) 54a-54n. The base station 52 and mobile units 54a-54n may be connected by a network 56. In one example, the network 56 may be implemented as a cellular communication network. However, other types of networks may be implemented accordingly to meet the design criteria of a particular implementation. The base station 52 may include a turbo encoder 60. Each of the mobile units 54a-54n may include a turbo decoder 70. Each of the turbo encoder 60 and/or the turbo decoders 70 may comprise an interleaver (to be described in more connection with FIG. 2). The interleaver in the turbo encoder 60 may be used to interleave signals transmitted by the base station 52 to the mobile units 54a-54n to reduce the effect of possible burst errors in the network 56. The interleaver in the turbo decoders 70 may be used to de-interleave the signals received from the base station 52.

Figure 2:
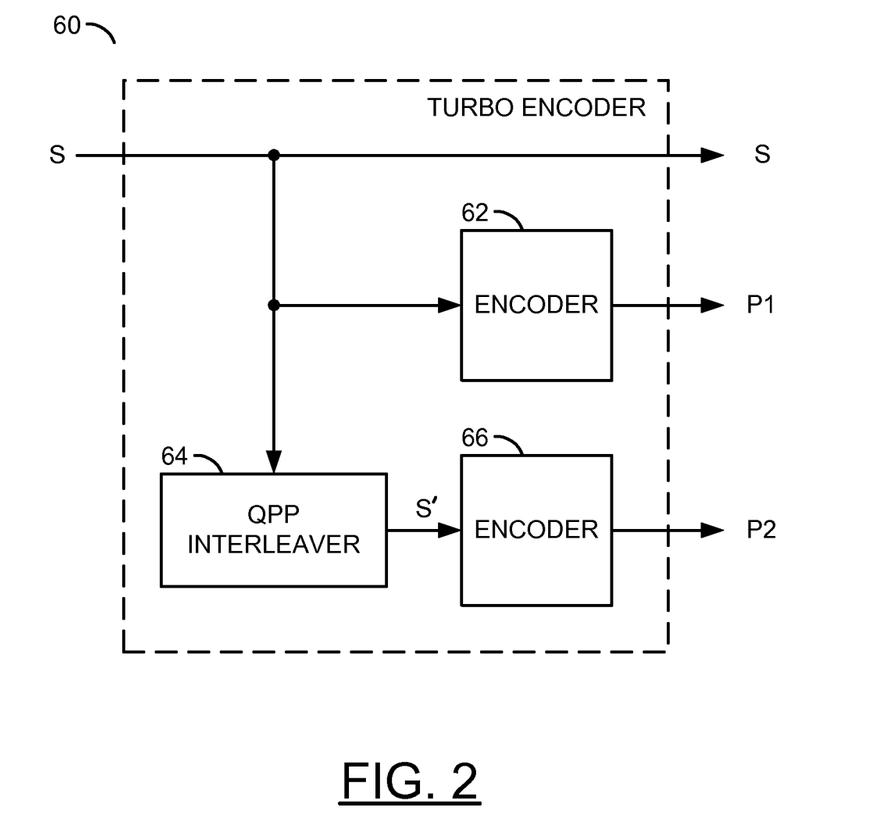
FIG. 2 is a block diagram illustrating a turbo encoder implemented with an interleaver address generator in accordance with an embodiment of the present invention.

Referring to FIG. 2, a block diagram of the turbo encoder 60 is shown implemented in accordance with an example embodiment of the present invention. The circuit 60 may comprise a block (or circuit) 62, a block (or circuit) 64, and a block (or circuit) 66. The circuit 62, the circuit 64 and/or the circuit 66 may represent modules and/or blocks that may be implemented as hardware, software generated hardware, a combination of hardware and/or software, or other implementations. The circuit 62 may be implemented as an encoder. The circuit 64 may be implemented as an interleaver. The circuit 66 may be implemented as an encoder. In one example, the circuits 62 and/or 66 may be implemented as constituent encoders.

A sequence to be turbo encoded may be presented (e.g., as a signal S) to an input of the circuit 62 and/or to an input of the circuit 64. The sequences may comprise a series of data arranged in a first order. In one example, the sequence S may comprise a systematic data sequence. An output of the circuit 62 may present an output signal (e.g., P1). In one example, the signal P1 may comprise parity information from the circuit 62. An output of the circuit 64 may present a signal (e.g., S') to an input of the circuit 66. The signal S' may represent the series of data from the sequences but arranged in a second order. The circuit 64 generally performs per mathematical relation (1) as follows:

$$\pi(x)=(f_1(x)+f_2(x)^2) \bmod K \quad (1)$$

where:
π(x)—address out
x—address
$f_1, f_2$—permutation parameters
K—block-code size.

An output of the circuit 66 may present an output signal (e.g., P2). In one example, the signal P2 may comprise parity information from the circuit 66.

Figure 3:
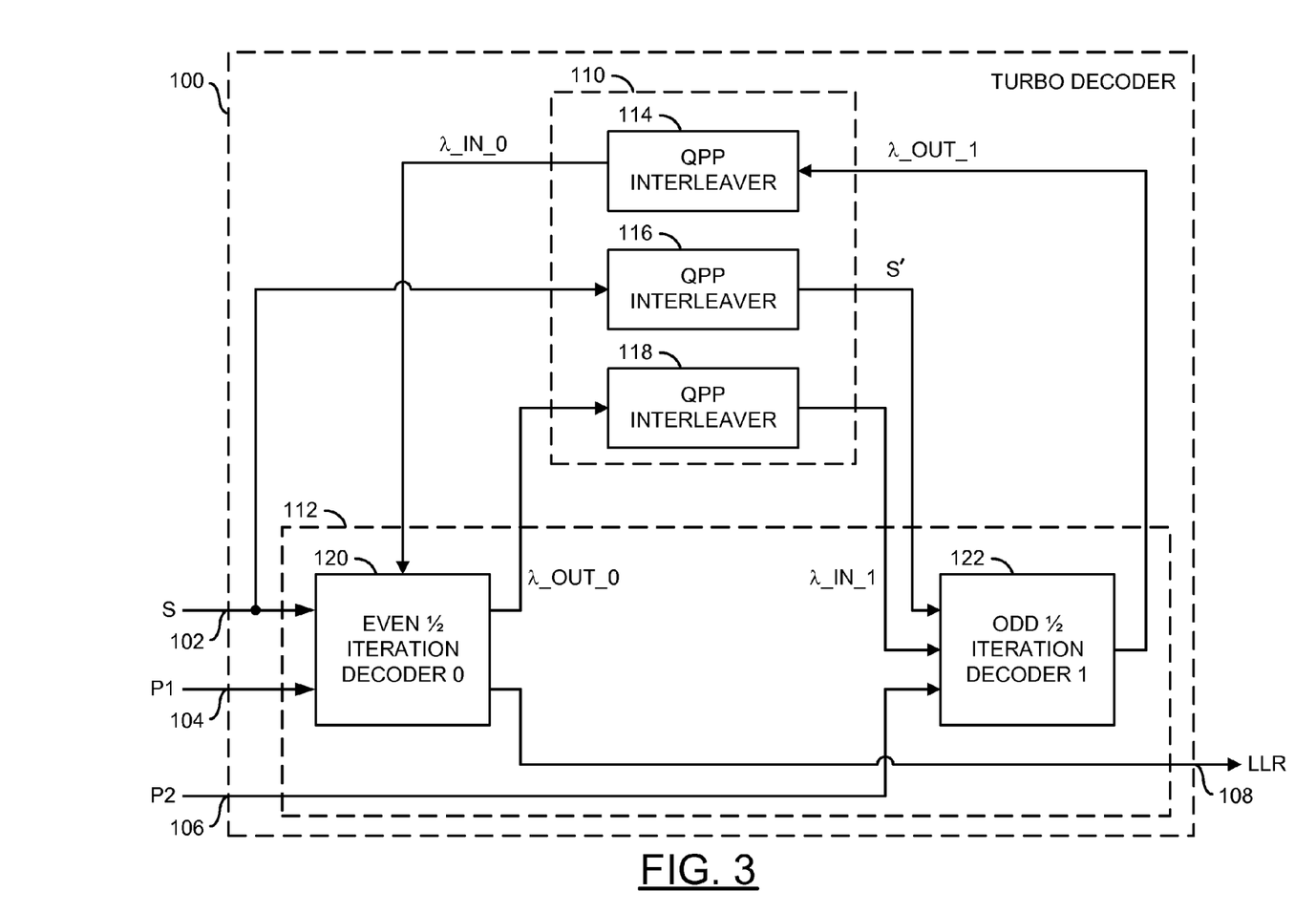
FIG. 3 is a block diagram illustrating a turbo decoder implemented with an interleaver address generator in accordance with an embodiment of the present invention.

Referring to FIG. 3, a block diagram of a turbo decoder 100 is shown in accordance with an example embodiment of the present invention. The turbo decoder 100 may perform de-interleaver operations by reading linear and/or writing interleaved. The turbo decoder 100 may be implemented using only interleavers, without the need for de-interleaves.

The circuit 100 may comprise a block (or circuit) 110 and a block (or circuit) 112. The circuit 110 may include a block (or circuit) 114, a block (or circuit) 116, and a block (or circuit) 118. The circuit 112 may include a block (or circuit) 120 and a block (or circuit) 122. The circuits 114, 116, 118, 120 and 122 may represent modules and/or blocks that may be implemented as hardware, software generated hardware cells, a combination of hardware and/or software. The circuits 114, 116 and/or 118 may be implemented as interleavers.

A sequence or block (e.g., a systematic data sequence) to be turbo decoded (e.g., in a mobile unit) may comprise triplets of values (e.g., S, P1, P2). The circuit 120 may have a first input that may receive the signal S, a second input that may receive the signal P1 and a third input that may receive a signal (e.g., λ_IN_0). An output of the circuit 120 may present a signal (e.g., λ_OUT_0) to an input of the circuit 118. In one example, the signal λ_OUT_0 may comprise a logarithm of a first likelihood ratio associated with the output of the circuit 120. An output of the circuit 118 may present a signal (e.g., λ_IN_1). An input of the circuit 112 may receive the signal S. An output of the circuit 116 may present a signal (e.g., S'). The signal may be presented to a first input of the circuit 122. The signal S' may be presented to a second input of the circuit 122. A third input of the circuit 122 may receive the signal P2. The circuit 122 may have an output that may present a signal (e.g., λ_OUT_1). In one example, the signal λ_OUT_1 may comprise a logarithm of a second likelihood ratio associated with the output of the circuit 122. The signal λ_OUT_1 may be presented to an input of the circuit 114. An output of the circuit 114 may present the signal λ_IN_0.

The circuit 100 may provide an implementation of an LTE turbo decoder with an architecture of a vector processor (e.g., P elements) and a single-bank memory (to be described in more detail in connection with FIG. 4). A memory structure may be implemented to achieve a parallelism degree (e.g., P) enabled by the LTE QPP-interleaver 110. The circuit 100 may be implemented with only one AGU to read and to write the S vector (e.g., P elements) and the A vector that may be used by the vector processor. The circuit 100 may be applicable for hardware and/or software LTE turbo decoder implementations.

Figure 4:
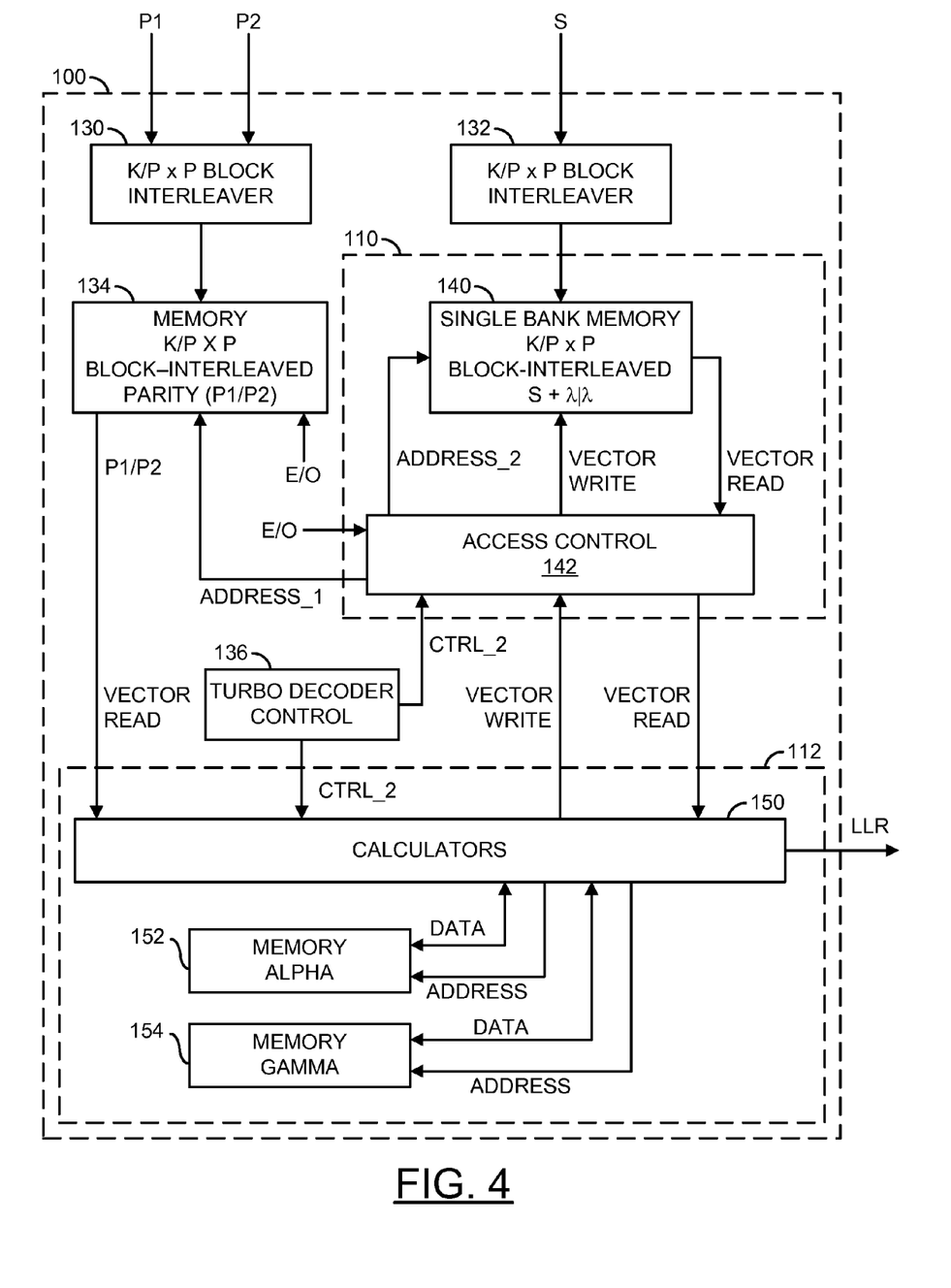
FIG. 4 is a more detailed diagram of the circuit of FIG. 3.

Referring to FIG. 4, a more detailed diagram of the circuit 100 is shown. The circuit 100 may also include a block (or circuit) 130, a block (or circuit) 132, a block (or circuit) 134 and a block (or circuit) 136. The circuit 130 may be an interleaver circuit that may receive a first parity signal (e.g., P1) and a second parity signal (e.g., P2). The circuit 132 may be an interleaver that may receive the signal S. The circuit 134 may implement block-interleaved parity on the signal P1 and the signal P2. The circuit 134 may receive a signal (e.g., E/O) and a signal (e.g., ADDRESS_1). The signal E/O may be an even/odd signal. The signal E/O may select either the parity signal P1 or the parity signal P2. A read address may be generated by the circuit 142. The circuit 136 may be implemented as a turbo decoder control circuit. The circuit 136 may be used to synchronize the access control block 142 with the calculators block 150. In one example, the circuit 134 may be implemented as two memories. The first memory may contain the parity signal P1. A second memory may contain the parity signal P2. The signal E/O may select between the first memory and the second memory.

An example of the circuit 112 is shown implementing a memory 152, a memory 154 and a block (or circuit) 150. The memory 152 may store alpha data. The memory 154 may store gamma data. The circuit 150 may be implemented as calculators circuit.

Figure 5:
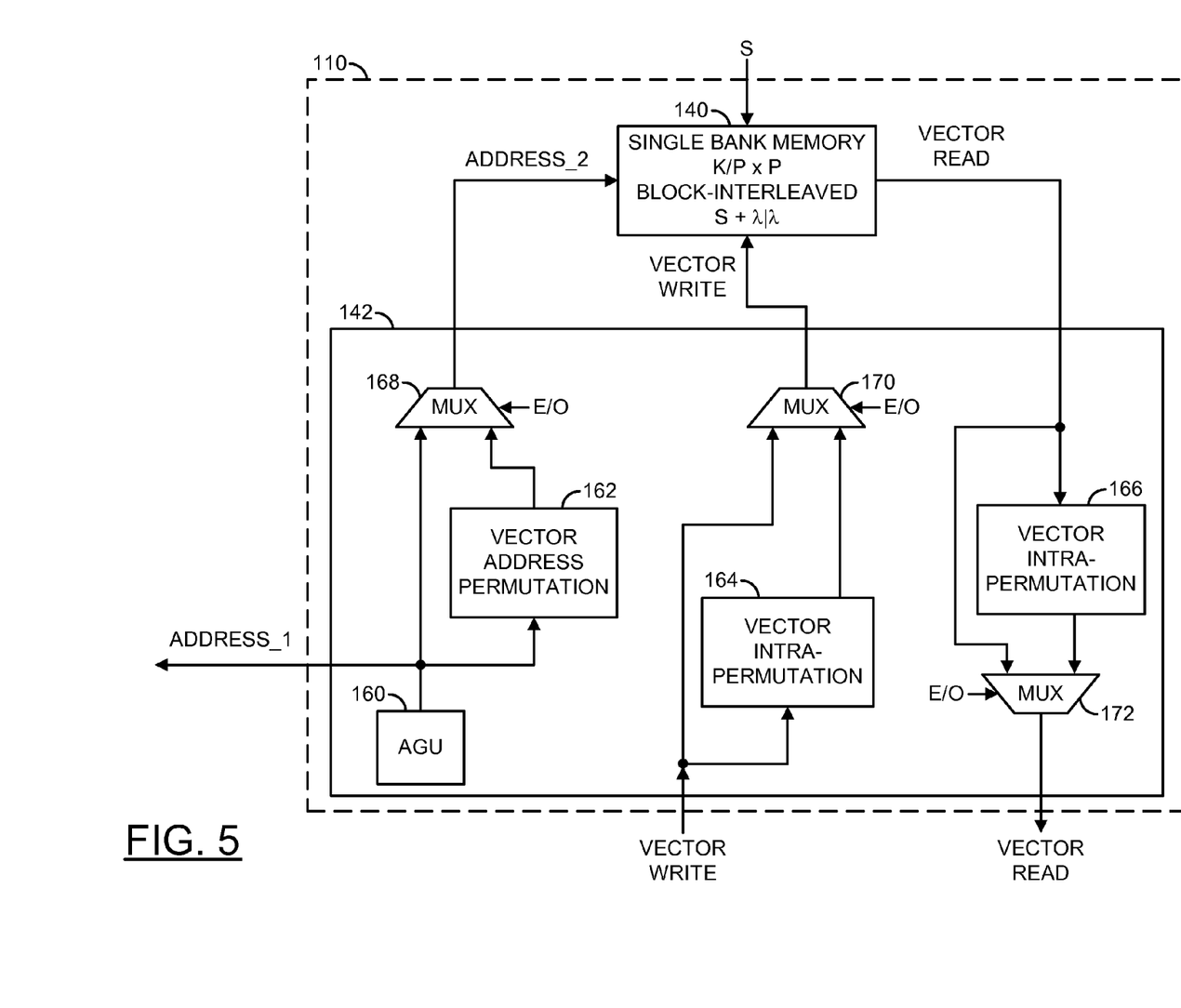
FIG. 5 is a diagram illustrating more details of the access control circuit of FIG. 4.

Referring to FIG. 5, a detailed diagram of the circuit 110 is shown. Details of the circuit 142 are shown. The circuit 142 generally comprises a block (or circuit) 160, a block (or circuit) 162, a block (or circuit) 164, a block (or circuit) 166, a block (or circuit) 168, a block (or circuit) 170 and a block (or circuit) 172. The circuit 160 may be implemented as an address generation unit (AGU). The circuit 160 may generate the vector address in a linear manner. The circuit 162 may be implemented as vector address permutation circuit. The circuit 162 may implement address permutation before accessing the memory 140. Details of such permutation are described in more detail in connection with FIG. 11. The circuit 164 may be implemented as a vector intra-permutations circuit. The written vector goes through an intra-permutation before being written to the memory 140. The circuit 166 may be implemented as a vector-intra-permutation circuit. The circuit 166 implements intra-permutation of the read vector before being read by the calculators circuit 150. Each of the circuits 168, 170 and 172 may be implemented as a multiplexer that responds to the signal E/O. The multiplexers 168, 170 and/or 172 may select between the permutation and regular input values based on the even and odd iterations.

Figure 6:
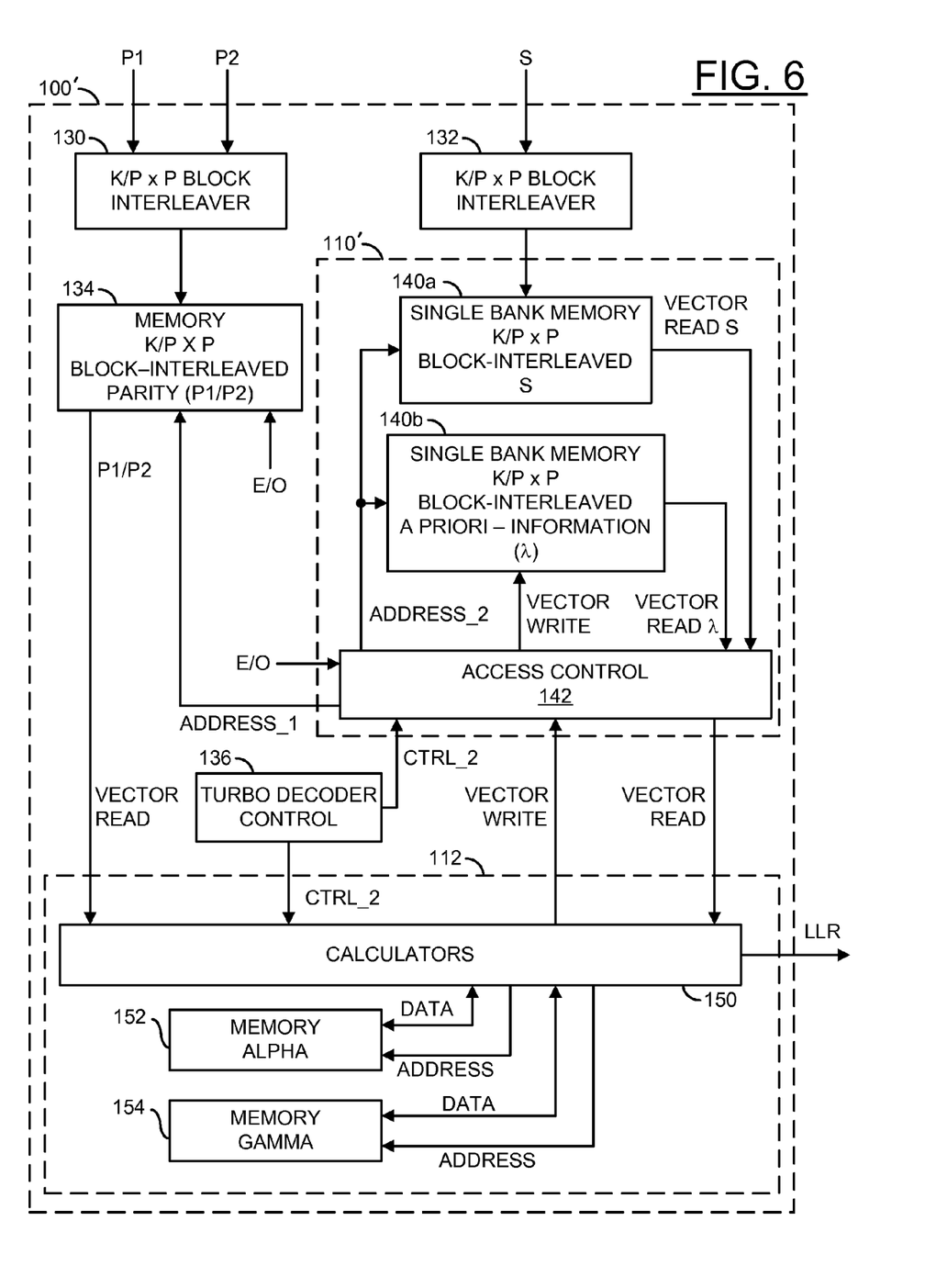
FIG. 6 is a block diagram implementing an alternate implementation of the circuit of FIG. 3.

Referring to FIG. 6, a diagram of a variation of a circuit 100' is shown. The circuit 100' is shown with an alternate circuit 110'. The memory 140 is shown divided into a memory 140a and a memory 140b. The circuit 110' may provide decoder operations of the block 110 and/or the block 112. The memory 140a may store the S vector. The memory 140b may store the A vector. The parity signal P1 and the parity signal P2 may be permuted by a P*W block-interleaver prior to reception by the circuit 130 in order to enhance the vector-processor performance.

Figure 7:
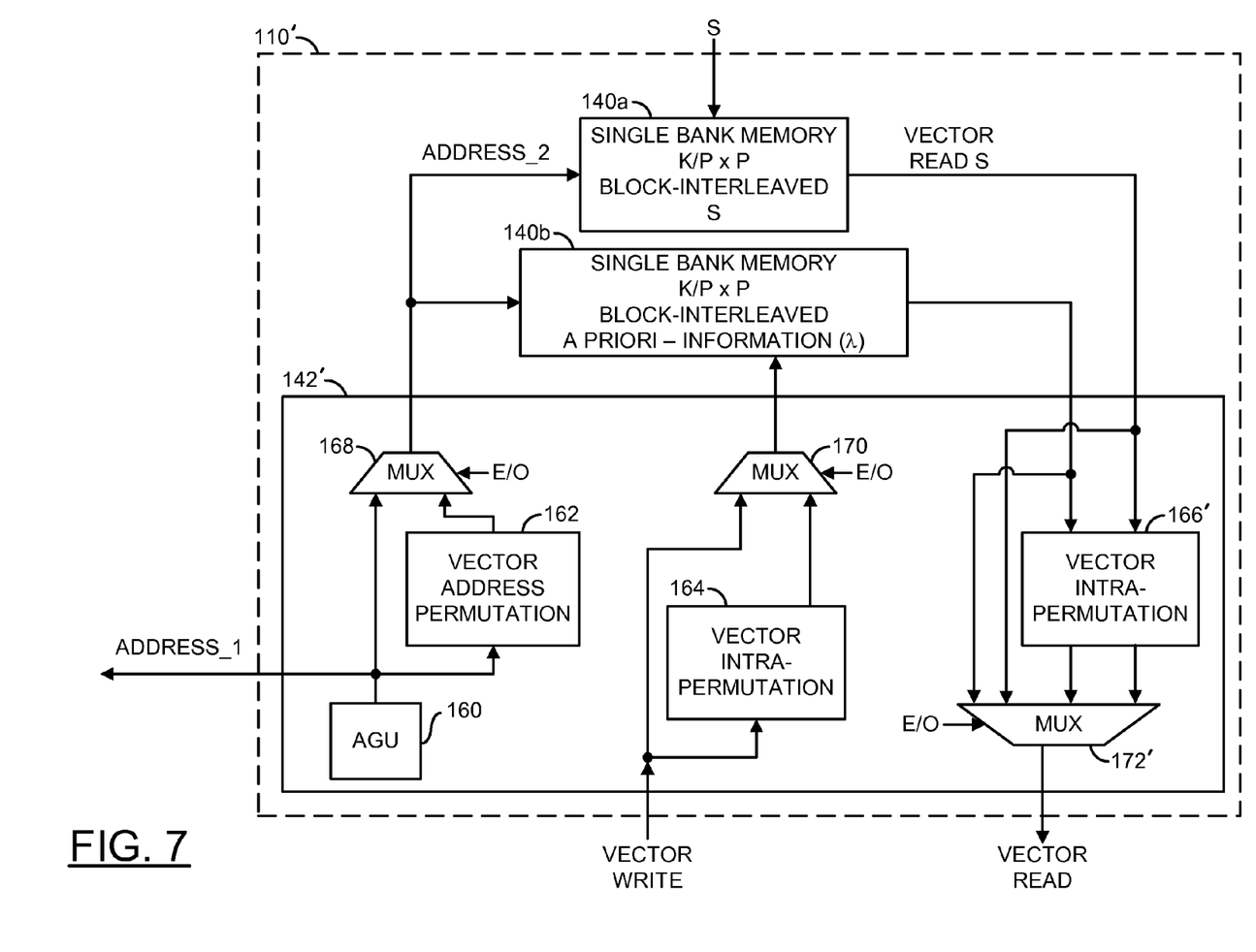
FIG. 7 is a detailed diagram of another embodiment of the access control circuit of FIG. 6.

Referring to FIG. 7, a detailed diagram of the circuit 110' is shown. The circuit 110' generally comprises the circuit 140a, the circuit 140b, and a block (or circuit) 142'. The circuit 142' may be implemented as a dual vector-intra-permutation circuit. In some embodiments, the circuit 166' may be implemented as two circuits. The circuit 172' may be implemented as two multiplexers. The multiplexers 168, 170 and 172' may select between the permutation and regular input values based on the even and odd iterations.

Figure 8:
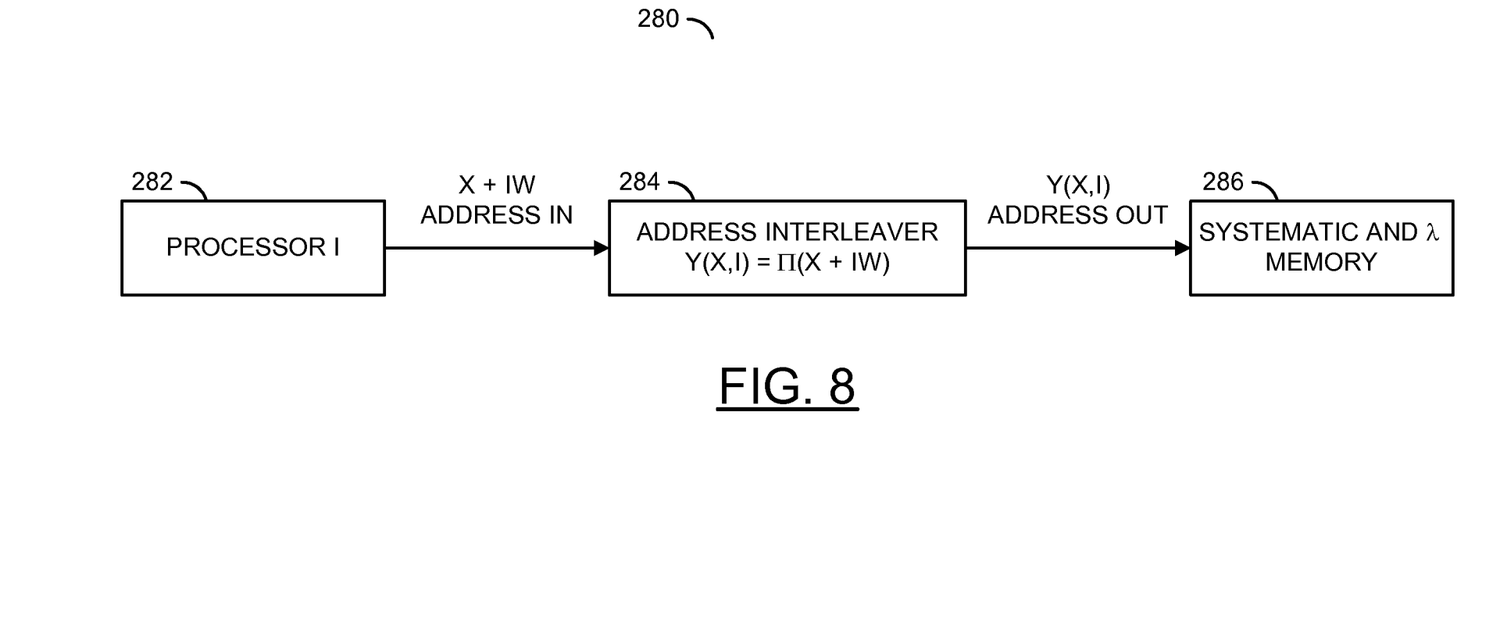
FIG. 8 is a flow diagram of an example address generation.

Referring to FIG. 8, a flow diagram of an example address generation method 280 is shown. The method 280 may comprise a step (or state) 282, a step (or state) 284 and a step (or state) 286. The steps 282-286 may represent modules and/or blocks that may be implemented as hardware, software, a combination of hardware and/or software. The LTE TD multi-processing architecture may include P processors that concurrently access P locations of in the block-code at P memory banks. The size of each memory bank may be W=K/P, where K is the block-code size. Each processor i generates memory addresses of the systematic information (s) and the a-priori-information ($\lambda$). The generated addresses may be given by mathematical expression (2) as follows:

$$z(x,i)=x+iK/P=x+iW \quad (2)$$

where:
z—processor non-interleaved address
x=0, ..., W−1 address offset
i=0, ..., P−1 processor index
K—block-code length
P—Parallelism degree
W—memory bank size.

The memory addresses generated by each processor i in the step 282 may be permuted by the QPP interleaver 110 in the step 284 during the odd ½ iterations. The QPP interleaver permutation generally manipulates the address for selection of the memory-bank and an address in the step 286. The QPP interleaver permutation may be given by mathematical expression (3) as follows:

$$y(x,i)=\pi(x+iW) \quad (3)$$

where:
y—processor interleaved address
$\lambda$—QPP interleaver

Figure 9:
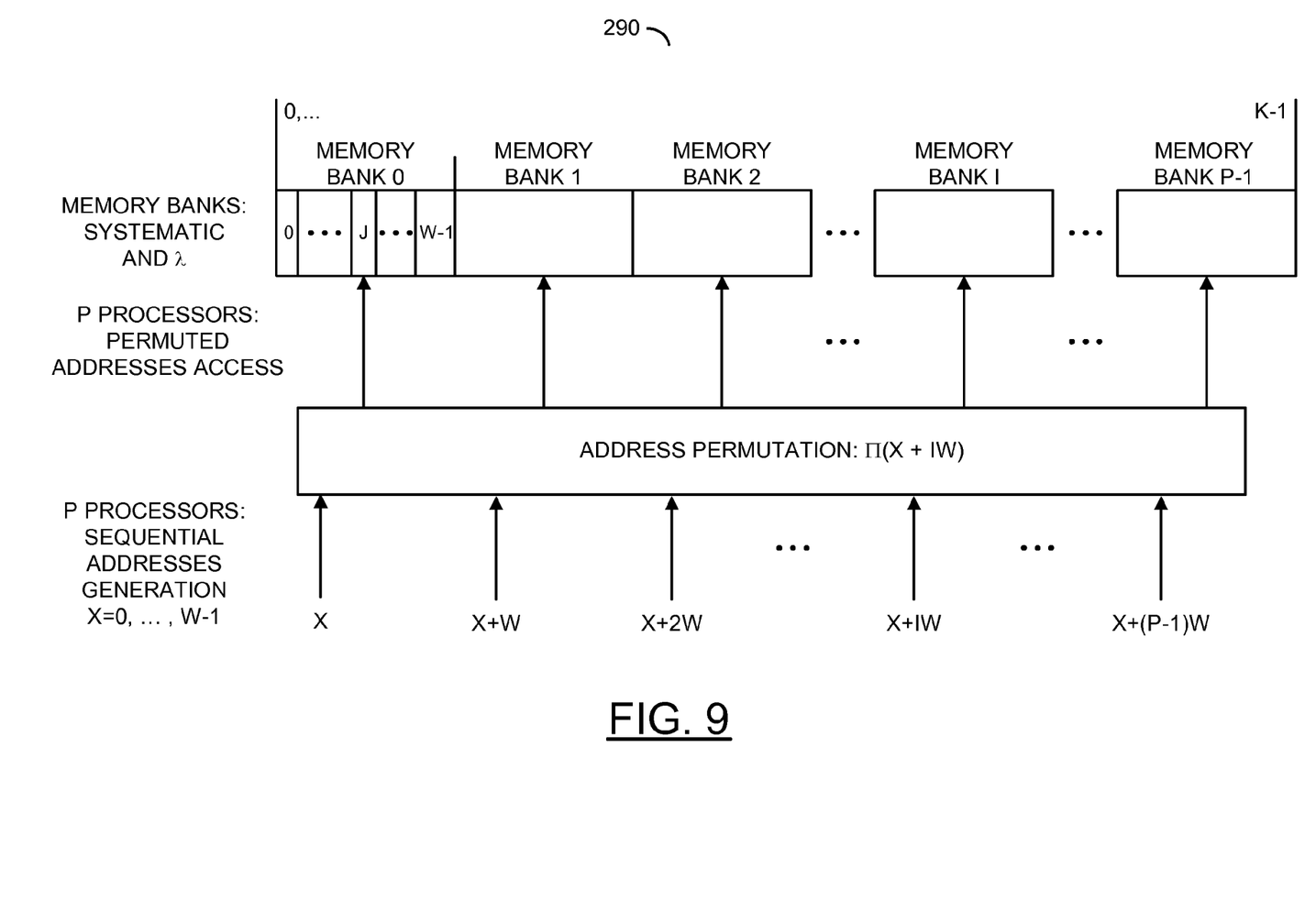
FIG. 9 is a diagram of an address permutation on the odd ½ iterations.

Referring to FIG. 9, a diagram of an address permutation 290 on the odd ½ iterations is shown. The P processor may generate a sequence of addresses (e.g., x, x+W, x+2W, ..., x+(P−1)W). The sequence of addresses may be permuted and presented to the circuits 140, 140a and/or 140b. Each permuted address generally accesses a corresponding memory bank (e.g., banks 0, ..., P−1).

Figure 10:
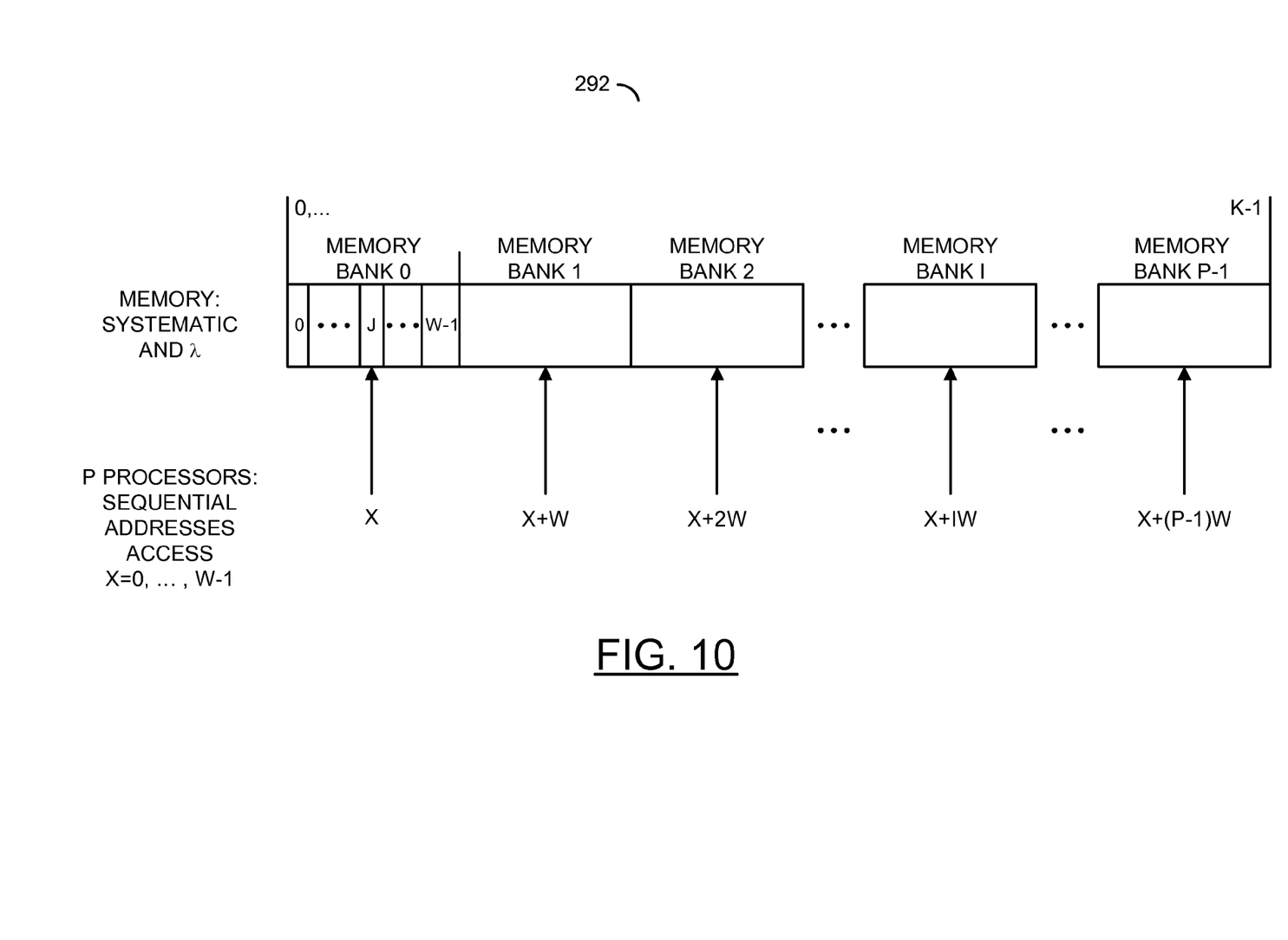
FIG. 10 is a diagram of an address generation on the even ½ iterations.

Referring to FIG. 10, a diagram of an address generation 292 on the even ½ iterations is shown. The P processor may generate a sequence of addresses (e.g., x, x+W, x+2W, ..., x+(P−1)W). The sequence of addresses may be presented as generated to the circuits 140, 140a and/or 140b. Each address generally accesses a corresponding memory bank (e.g., banks 0, ..., P−1).

For the odd ½ iterations, the P input addresses to the QPP-interleaver 110, given in equation (2), may result in P interleaved addresses given by mathematical expression (4) as follows:

$$\pi(x+iW) \bmod W = \pi(x) \bmod W \quad (4)$$

where,
i=0, ..., P−1 processor index proof, $$\pi(x+iW)\bmod W = ((f_1(x+iW)+f_2(x+iW)^2)\bmod K)\bmod W = \\ ((f_1 x + f_2 x^2 + i(f_1 + 2f_2 x + if_2 W)W)\bmod K)\bmod W = (\pi \\ (x) + (i(f_1 + 2f_2 x + if_2 W))\bmod PW)\bmod W = (\pi(x) + (i \\ (f_1 + 2f_2 x + if_2 W)\bmod P)W)\bmod W = \pi(x)\bmod W$$

Figure 11:
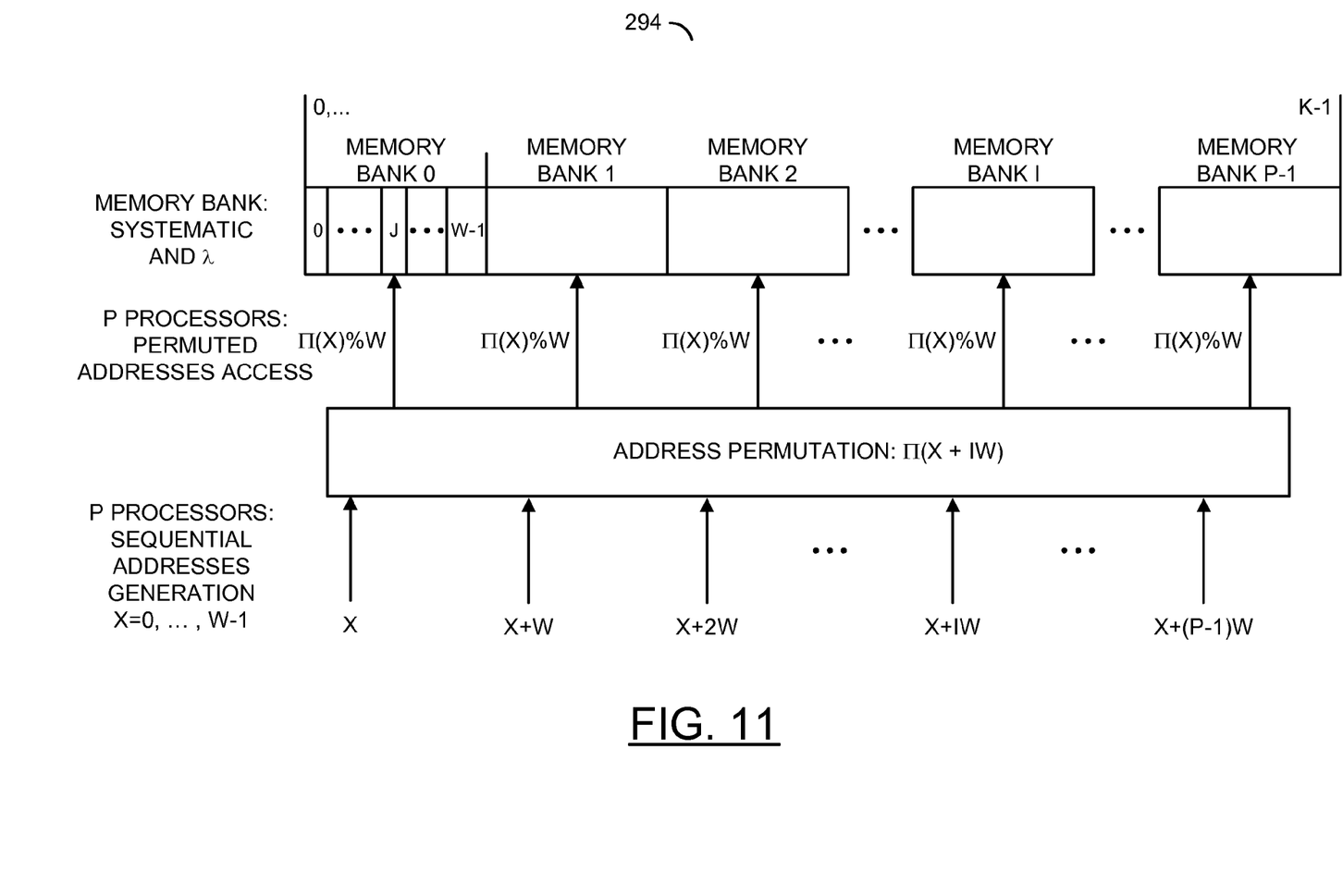
FIG. 11 is a diagram of a multi-access memory architecture on the % odd iterations.

Referring to FIG. 11, a diagram of a multi-access memory architecture 294 on the ½ odd iterations is shown. The result given in (4) generally means that all of the P processors access, for a given address x, the same address in the different memory banks. Any set of P elements data, which may be located in P memory banks at the same address (e.g., an element data located in a memory bank), is generally defined as a vector of P elements. Instead of using an AGU per processor, the vector may be read or written with only a single AGU that access single-bank memory which has the size of K=P*W. A P*W block-interleaves may stack the P elements of each vector in a row of a single-bank memory. Therefore, using P*W block-interleaver on the systematic and $\lambda$ generally enables a vector access by only a single memory access. The address of the memory access may be handled with a single vector-processor AGU.

Figure 12:
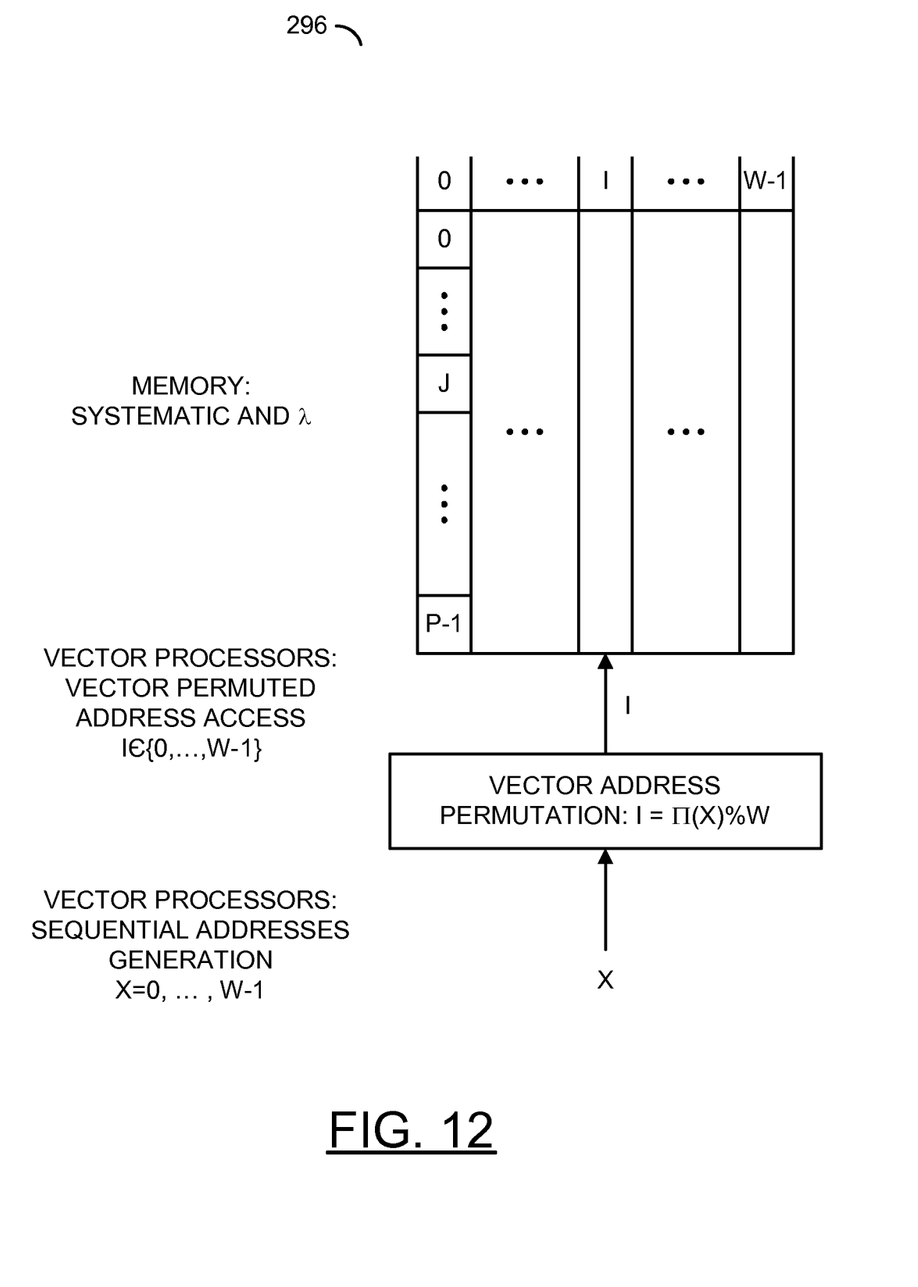
FIG. 12 is a drawing of a vector-access memory architecture on the odd ½ iterations.

Referring to FIG. 12, a drawing of a vector-access memory architecture 296 on the odd ½ iterations is shown. The architecture 286 may implement a single access multiple data read of vector x and vector $\lambda$ to feed the P vector units. The vector processor may generate a sequence of addresses X (e.g., X=0, ..., W−1). The vector processor may permute the sequence of addresses X into a sequence of addresses I (e.g., I∈{0, ..., W−1}). The sequence of addresses I may be used to access the memory bank of the circuits 140, 140a and/or 140b.

Figure 13:
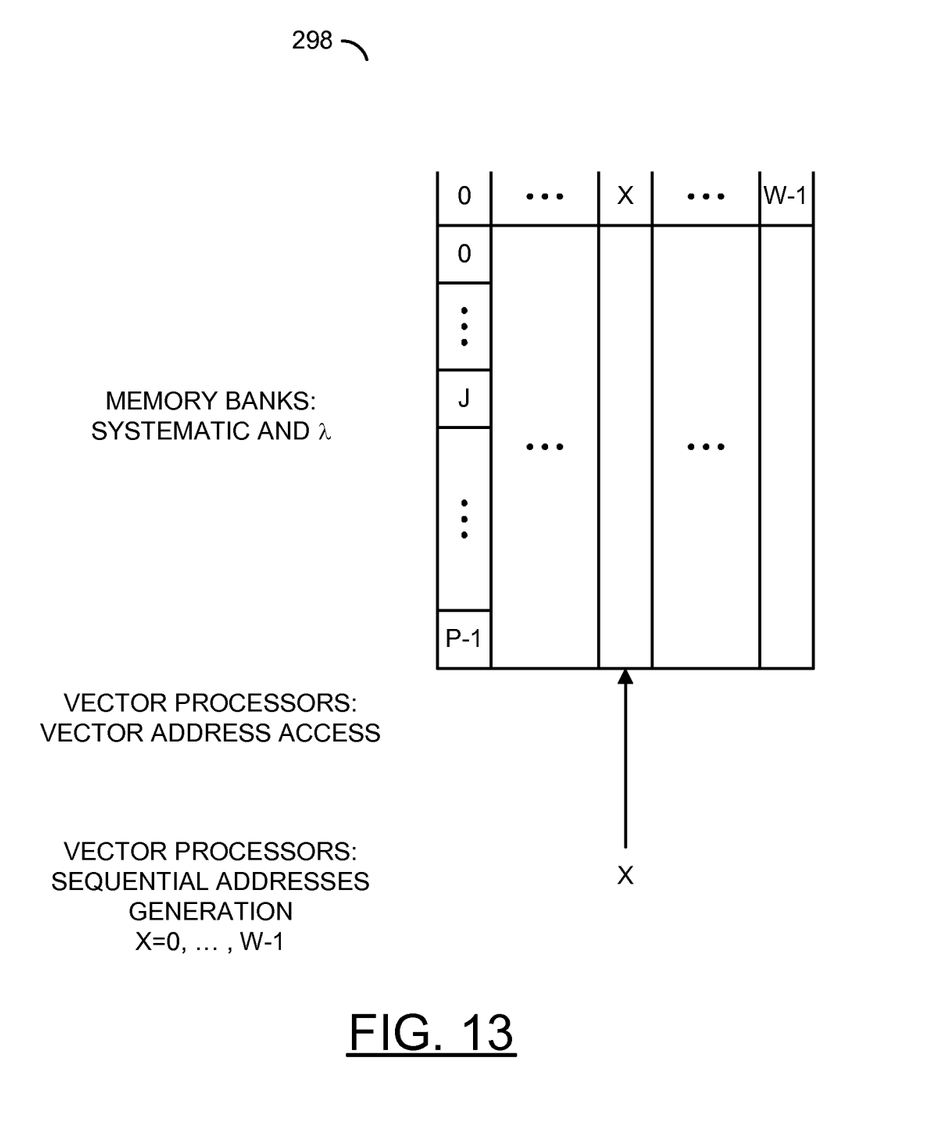
FIG. 13 is a drawing of a vector-access memory architecture on the even ½ iterations.

Referring to FIG. 13, a drawing of a vector-access memory architecture 298 on the even ½ iterations is shown. The architecture 286 may implement a single access multiple data read of vector x and vector $\lambda$ to feed the P vector units. The vector processor may generate a sequence of addresses X (e.g., X=0, ..., W−1). The sequence of addresses X may subsequently be used to access the memory bank of the circuits 140, 140a and/or 140b.

Some embodiments of the invention may provide a solution for the LTE TD using an architecture of a vector-processor with P degree and a single-bank memory. The architecture generally uses a single-bank memory and yet achieves the parallelism degree of P. The P parallelism degree may be enabled by the LTE QPP-interleaver 110. Moreover, only a single AGU may be implemented to read and to write the s vector and the A vector. The vectors may be utilized by the TD process which supports the P parallelism degree.

The QPP interleaver generally comprises two stages, (i) a vector address permutation that generates the new address for the vector and (ii) a vector intra permutation that permutes the P elements of the vector.

The vector address-permutation may be given by mathematical expression (5) as follows:

$$\text{permuted vector address}(x) = pva(x) = \pi(x) \bmod W \quad (5)$$

where,
x—vector address
x=0, ..., W−1

In the even iterations, there generally is no vector address-permutation and the vector address may be generated sequentially (e.g., 0, 1, . . . W−1).

The vector intra-permutation may be given by mathematical expression (6) as follows:

$$\text{permuted vector } (x,i) = pv(x,i) = \lfloor \pi(x+iW)/W \rfloor = \lfloor ((f_1(x+iW)+f_2(x+iW)^2) \bmod K)/W \rfloor$$

where, i−0, . . . , P−1

In the even ½ iterations, there may be no vector intra-permutation. The vector intra-permutation may be done during the memory read access or during the vector elements distribution in the vector-processor.

The schemes generally described herein implement a context in which only a single AGU is used to access the s vector, the λ vector, the parity 1 (e.g., p1) vector and the parity 2 (e.g., p2) vector.

As used herein, the term "simultaneously" is meant to describe events that share some common time period but the term is not meant to be limited to events that begin at the same point in time, end at the same point in time, or have the same duration.

While the invention has been particularly shown and described with reference to the preferred embodiments thereof, it will be understood by those skilled in the art that various changes in form and details may be made without departing from the scope of the invention.

The invention claimed is:

1. An apparatus comprising:
    a decoder circuit configured to generate a single address signal to read a first parity data signal, a second parity data signal and read and/or write systematic information data, a first a-priori-information signal and a second a-priori-information signal, wherein said decoder circuit (i) reads said first parity data signal, said systematic information data and said first a-priori-information during even half-iterations of a decoding operation and (ii) reads said second parity data, said systematic information data and said second a-priori-information during odd half-iterations of said decoding operation; and
    a memory configured to store (i) said systematic information data in a first single bank memory and (ii) said first and second a-priori-information signals in a second single bank memory, wherein said systematic information data and said first and second a-priori-information signals are accessible by said single address signal pointing to a similar address in said first single bank memory and said second single bank memory.

2. The apparatus according to claim 1, wherein said address signal comprises a permuted address value during said odd half-iterations and a sequentially generated address value during said even half-iterations.

3. The apparatus according to claim 1, wherein (A) said decoder circuit comprises an address generation unit configured to generate address values sequentially, and (B) vector address-permutation is used to generate said address signal in response to sequentially generated address values during said odd half-iterations and sequentially generated address values are presented in said address signal without vector address-permutation during said even half-iterations.

4. The apparatus according to claim 1, wherein said decoder circuit is further configured to perform vector intra-permutation on information written to said memory during said odd half-iterations and write information to said memory without vector intra-permutation during said even half-iterations.

5. The apparatus according to claim 1, wherein said decoder circuit is further configured to perform vector intra-permutation on information read from said memory during said odd half-iterations and read information from said memory without vector intra-permutation during said even half-iterations.

6. The apparatus according to claim 1, further comprising a parity memory configured to store said parity data, wherein said decoder circuit is further configured to read a first parity vector and a second parity vector from said parity memory in response to said address signal.

7. The apparatus according to claim 6, further comprising:
    a first interleaver configured to initialize said systematic information data in said first single bank memory; and
    a second interleaver configured to initialize said parity data in said second single bank memory.

8. The apparatus according to claim 6, wherein said decoder circuit is further configured to read and write one or more metrics of said decoding operation in one or more additional memories.

9. The apparatus according to claim 1, wherein said memory and said decoder circuit are part of a turbo decoder circuit.

10. The apparatus according to claim 1, wherein said apparatus is implemented in a cellular telephone mobile unit.

11. A method for turbo decoding, comprising the steps of:
    generating a single address signal to read a first parity data signal, a second parity data signal and read and/or write systematic information data, a first a-priori-information signal and a second a-priori-information signal;
    reading said first parity data signal, said systematic information data and said first a-priori-information during even half-iterations of a decoding operation;
    reading said second parity data, said systematic information data and said second a-priori-information during odd half-iterations of said decoding operation; and
    configuring a memory to store (i) said systematic information data in a first single bank memory and (ii) said first and second a-priori-information signals in a second single bank memory, wherein said systematic information data and said first and second a-priori-information signals are accessible by said single address signal pointing to a similar address in said first single bank memory and said second single bank memory.

12. An apparatus for turbo decoding, comprising:
    means for generating a single address signal to read a first parity data signal, a second parity data signal and read and/or write systematic information data, a first a-priori-information signal and a second a-priori-information signal;
    means for reading said first parity data signal, said systematic information data and said first a-priori-information during even half-iterations of a decoding operation;
    means for reading said second parity data, said systematic information data and said second a-priori-information during odd half-iterations of said decoding operation; and
    means for configuring a memory to store (i) said systematic information data in a first single bank memory and (ii) said first and second a-priori-information signals in a second single bank memory, wherein said systematic information data and said first and second a-priori-information signals are accessible by said single address signal pointing to a similar address in said first single bank memory and said second single bank memory.

* * * * *